United States Patent
Knapp et al.

(10) Patent No.: US 6,677,672 B2
(45) Date of Patent: Jan. 13, 2004

(54) STRUCTURE AND METHOD OF FORMING A MULTIPLE LEADFRAME SEMICONDUCTOR DEVICE

(75) Inventors: James H. Knapp, Gilbert, AZ (US); Stephen C. St. Germain, Scottsdale, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 10/133,527

(22) Filed: Apr. 26, 2002

(65) Prior Publication Data
US 2003/0209804 A1 Nov. 13, 2003

(51) Int. Cl.[7] ................ H01L 23/22; H01L 23/02; H01L 23/495
(52) U.S. Cl. ................ 257/687; 257/686; 257/676
(58) Field of Search ................ 257/687, 686, 257/676, 723

(56) References Cited

U.S. PATENT DOCUMENTS

| | | | |
|---|---|---|---|
| 5,243,498 A | 9/1993 | Scofield | |
| 5,629,563 A | 5/1997 | Takiar et al. | |
| 6,143,981 A | 11/2000 | Glenn | |
| 6,236,109 B1 | 5/2001 | Hsuan et al. | |
| 6,284,570 B1 | 9/2001 | Betran et al. | |
| 6,369,454 B1 | 4/2002 | Chung | |
| 6,458,617 B1 * | 10/2002 | Liao et al. | 438/51 |
| 6,507,098 B1 | 1/2003 | Lo et al. | |
| 2002/0020907 A1 * | 2/2002 | Seo et al. | 257/687 |
| 2002/0031856 A1 * | 3/2002 | Lee et al. | 438/106 |

OTHER PUBLICATIONS

IEEE Transactions On Components, Packaging, And Manufacturing Technology–Part B, vol. 21, No. 1, Feb. 1998, "A Review of 3–D Packaging Technology" by Al–sarawi et al.

* cited by examiner

Primary Examiner—Amir Zarabian
Assistant Examiner—Kiesha Rose
(74) Attorney, Agent, or Firm—James J. Stipanuk

(57) ABSTRACT

A semiconductor device (20) has a first leadframe (200) with a first semiconductor die (70) electrically coupled to one of its leads. A second semiconductor die (130) is mounted to a second leadframe (300) that has a first lead (35, 150) electrically coupled to the second semiconductor die and a second lead (30, 35) mounted to the lead of the first leadframe.

20 Claims, 5 Drawing Sheets

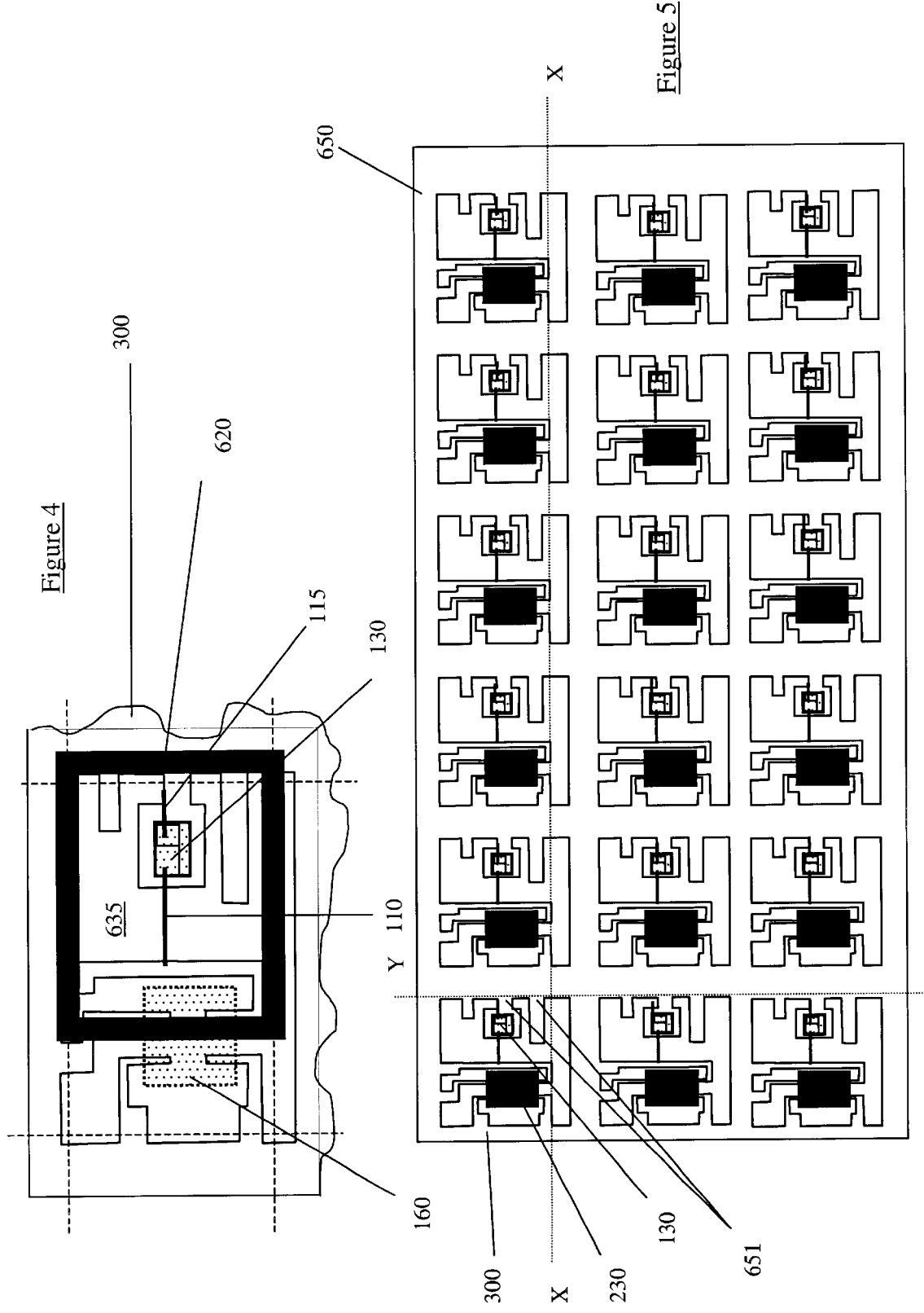

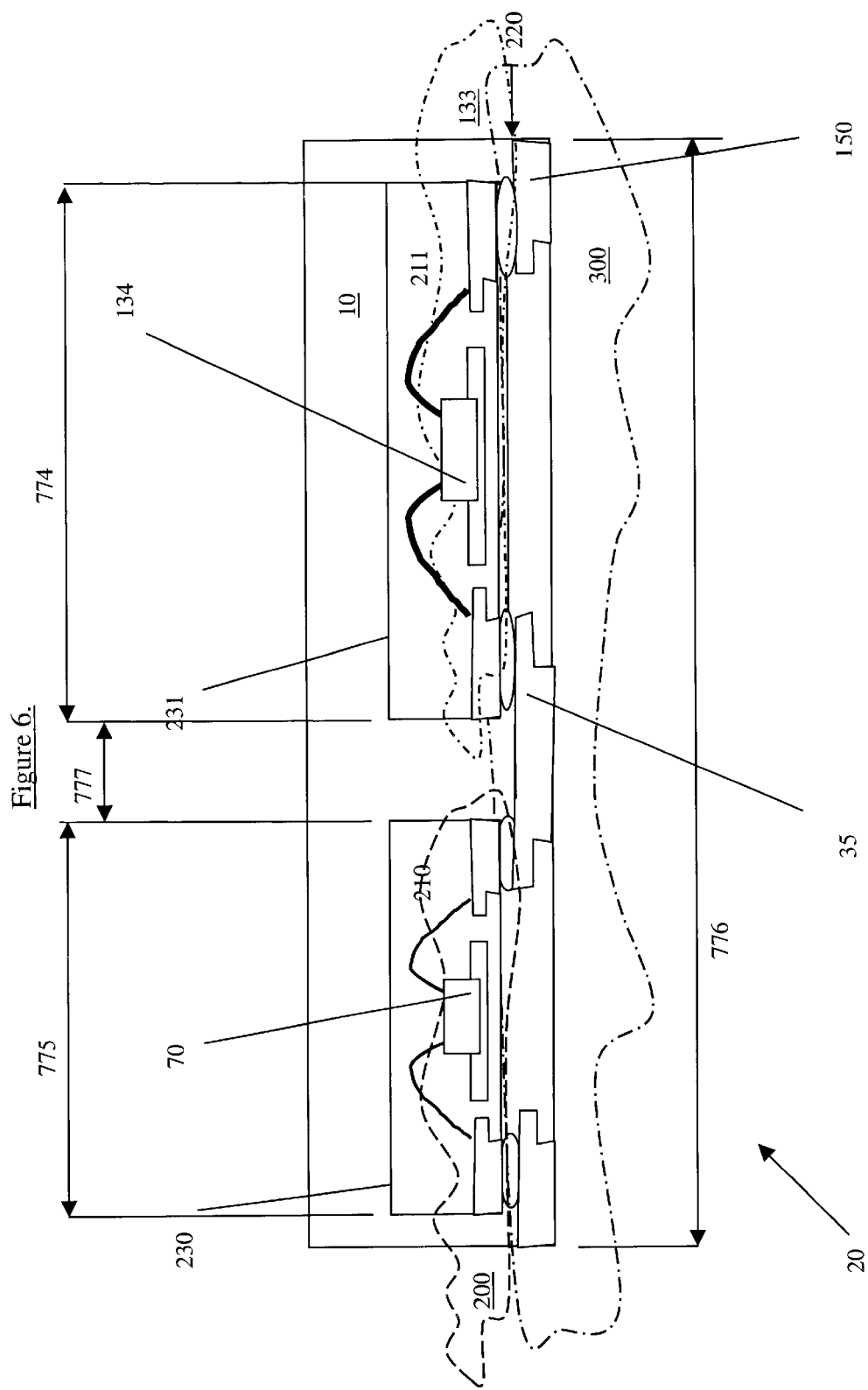

STRUCTURE AND METHOD OF FORMING A MULTIPLE LEADFRAME SEMICONDUCTOR DEVICE

FIELD OF THE INVENTION

The present invention relates in general to semiconductor device packaging and, more particularly, to forming a semiconductor device having more than one leadframe and more than one device contained within.

BACKGROUND OF THE INVENTION

In general, contemporary electronic devices are designed with critical design criteria such as size, weight and power consumption in mind. Such criteria are continuously diminished, as the designs become more complex to enable greater functionality. Demand for enhanced functionality and performance has resulted in attempts by component manufacturers to integrate devices based on different technologies in a single package.

One approach is to place two or more bare semiconductor dice on a substrate having a conductive network formed to provide electrical interconnection of the dice to form a multi-chip module, or MCM. The substrates used in MCMs are typically multi-level printed circuit boards, where some of interconnections are run external to the module for connection to the customers' printed circuit board. The substrate of the MCM is then covered with a lid or encapsulant to form a finished packaged device.

An example of a prior art multi-chip module 500 configured as a voltage regulator is provided in FIG. 1. As shown, the MCM voltage regulator 500 includes a printed circuit board 520 that supports a plurality of dice 540 and 542, where the dice are wire bonded to the printed circuit board traces 530–532 by wires 560, 561.

Typical of many MCMs that use mixed die technology to realize device 500, die 542 is a drive transistor of power MOSFET technology, and die 540 is a voltage regulator switch of analog technology. Thus, the wire bonds required by power MOSFET die 542 to carry large currents are of large aluminum or aluminum alloy wire (for example one hundred twenty-five micrometers in diameter), and the wire bonds required by the analog die 540 for fast signal transmission and low attenuation are of small gold or gold alloy (for example fifty micrometers in diameter).

The bond head of a tool that bonds the gold wires is about two hundred fifty micrometers in diameter and for the aluminum wire it is about four thousand micrometers in diameter. The different wire bond materials used require that the traces have a compatible surface material present for best performance and reliability to attach the wire bond. In this example, trace 532 and a portion 534 of trace 531 are plated at least partially with a silver nickel alloy to facilitate the gold wire bond attach. Aluminum bond wires 561 for the power MOSFET are attached to trace 530 and a copper region 533 of trace 531. The aluminum wire bonds are made before the gold wire bonds as the high temperatures used to bond the gold wires oxidizes the copper traces which would result in the aluminum bond having poor strength and reliability.

The traces are further connected to the external leads 510 of the finished MCM to provide electrical connection to a customer printed circuit board having a connection pitch or distance 503.

A distance 501 must be provided between bond leads to allow a window frame (not shown) used to hold the substrate during the wire bonding process to clear all wires and devices. This provision of distance described above results in a long effective conductivity path 502 between die pad 871 of analog switch. 540 and die pad 872 of drive transistor 542. The long effective conductivity path degrades signal transmission especially in applications requiring fast electrical response or those carrying small electrical currents.

The module is sealed from the environment using an encapsulant 590 to form a finished multi-chip module. MCM's thus formed, while expensive, are highly space efficient and require less printed circuit board space than individually packaged devices placed on the customer's circuit board.

Reliability of multi-chip modules is very important to manufacturers and users. Complete functional testing of the various semiconductor dice used, particularly high speed testing and testing after burn-in are fundamental techniques to ensure reliability. A drawback of multi-chip modules is they are extremely difficult to test because only some of the contact pads of the semiconductor dice can be coupled to an external tester by way of leads that extend from the package. Testing is further problematic as it is difficult or impossible to test the semiconductor dice fully before they are mounted to the substrate. Moreover, once the various semiconductor dice are connected to each other, their characteristics are modified; parasitics created by the interconnection become difficult, if not impossible, to measure. Testing is particularly difficult at high speeds. Thus the functionality of the integrated die chips inside the multi-chip module cannot be completely tested because there is no way to couple a tester to individual contact pads on the individual semiconductor die.

Furthermore, MCM's are very expensive to make, as the multi layer printed circuit board that acts as the substrate is complex to manufacture. In addition, different types of die within the module require different assembly equipment, materials and methods to attach them to the substrate. Attachment introduces further problems. Due to window frames that must be used during the bonding process to hold down the substrate while wire bonding and the sizes of the bond tool heads, space must be provided between leads for these items to allow wire bonding, which in turn limits the density. In general, the larger the bond wires the larger the areas around the die that need to be set aside for the window frames used to hold down the substrate.

A further problem with MCM printed circuit boards is that it is expensive and complex to make traces of varying material for wire bonding. For example, power devices are preferably wire bonded to large, thick traces to conduct large currents and heat, while analog devices are preferably wire bonded to thin and short traces for the speed needed by the analog devices. These problems with MCM's have resulted in low yields and high costs.

Accordingly, it would be advantageous to have a structure and method of forming a semiconductor device that has the advantage of allowing integration of multiple semiconductor dice into a single packaged device while avoiding the problems of prior art.

BRIEF DESCRIPTION OF THE DRAWINGS

FIG. 4 is a top view of the semiconductor device of FIG. 2;

FIG. 5 is a second top view of the semiconductor device of FIG. 2; and

FIG. 6 is a cross sectional view of an alternate embodiment of the semiconductor device.

DETAILED DESCRIPTION OF THE DRAWINGS

Figure 2:
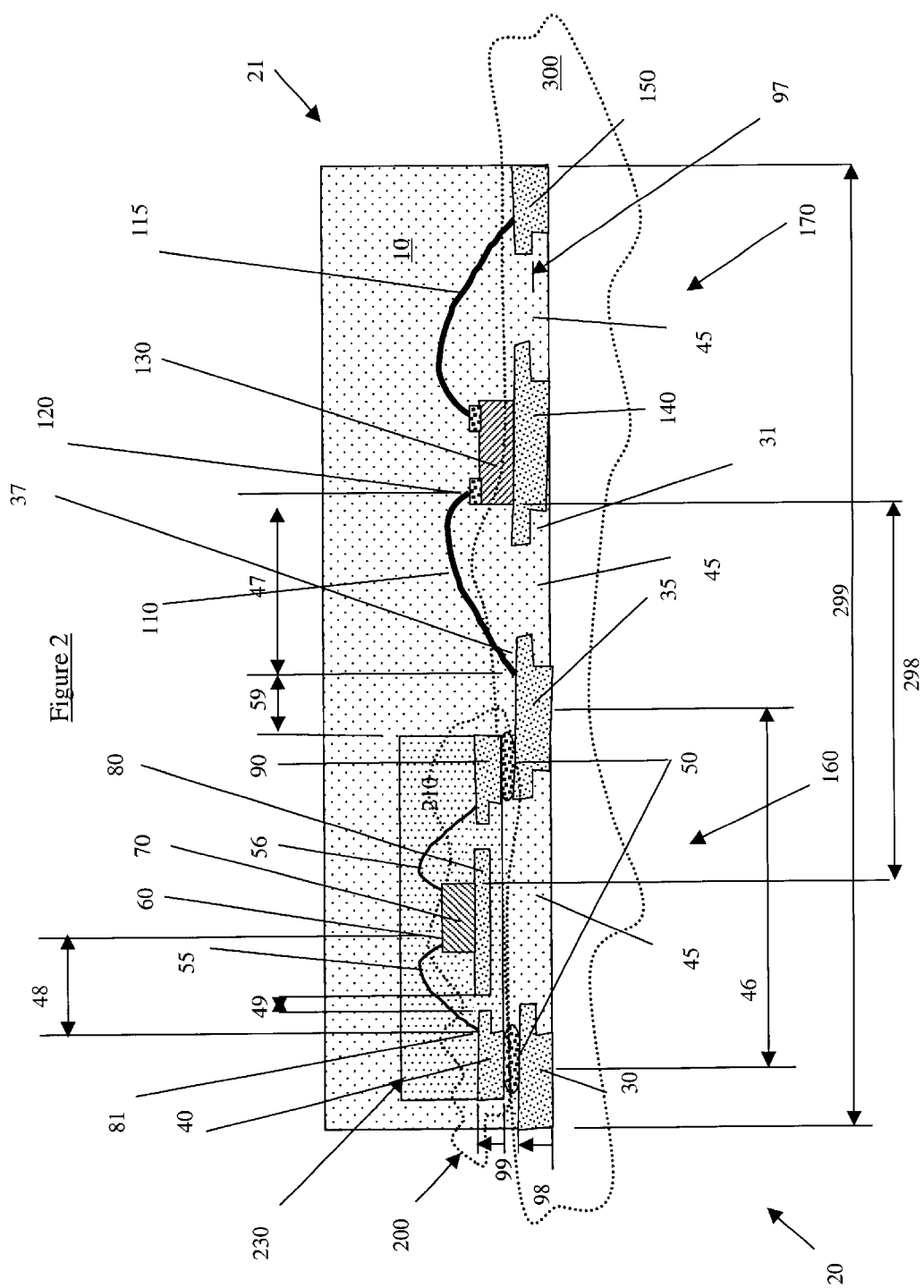
FIG. 2 is a cross sectional view of a semiconductor device.

In FIG. 2, a cross sectional view showing a semiconductor component or device 20 including a packaged semiconductor component or device 230 and a semiconductor die 130 housed in a semiconductor package 21. Packaged semiconductor device 230 is mounted in a region 160 of a leadframe 300 and a semiconductor die 130 mounted in a region 170 of leadframe 300. Leadframe 300, packaged semiconductor die 230, and semiconductor die 130 are covered with an encapsulant material 10 to form the finished semiconductor device 20. In one embodiment, semiconductor device 20 is configured as a voltage regulator with packaged semiconductor device 230 being an analog switch and semiconductor die 130 comprises a power transistor.

Packaged semiconductor die 230 is comprised of a semiconductor device or die 70 mounted and electrically coupled to a leadframe 200 having a thickness 99 selected to provide a small lateral spacing or gap 49. Thickness 99 is typically about two hundred micrometers for an analog switch application. Leadframe 200 is formed by patterning and etching a metal sheet to remove material to electrically isolate leads and other features. That is, when etching metal material to form leadframe 200, particular attention is given to thickness 99 of leadframe 200 in relation to the formation of leads 40 and 90 and flag 80. The thickness 99 of the leadframe essentially determines the minimum gap 49 that can be formed between features like leads 40 and 90 or flag 80. Hence, small lateral dimensions require thickness 99 to be reduced proportionately due to the etching characteristics of the processes used. Thus for small pitches or lateral dimensions, the thickness 99 is consequently reduced. In general, producing leadframes with reduced lateral dimensions is more costly than those having larger lateral dimensions.

Die 70 is electrically coupled to flag 80 using an adhesive or solder (not shown) and to lead 40 by bonding wire 55. Bonding wire 55 is attached as typical in the art using a small wire bond tool (not shown) at a first location 60 on the die 70 and then drawn over to the lead 40 where it is then thermally attached to a portion 81 and the tool removed. Portion 81 of lead 40 includes a nickel silver alloy coating to promote the adhesion of the bonding wire. Additionally, during the wire bonding process, a window frame (not shown) holds down the leadframe to keep it from moving during the wire bonding process. The window frame has an opening or window that allows for the wire bond tool head to travel a distance 48 within the window of the window frame while bonding from the die to the lead. The wire bond tool head is approximately 10 mils in diameter. Similarly, a bonding wire 56 is connected from die 70 to lead 90. In one embodiment, bonding wires 55 and 56 include gold material. In one embodiment, bonding wires 55 and 56 are formed to a diameter of less than fifty micrometers, which is considered to be a small diameter for a bonding wire. Such small diameter gold wire is used to promote the transmission properties of signals carried on wire bonds 55–56. Leadframe 200 in one embodiment is covered with an encapsulant material 210 to form the packaged semiconductor die 230.

Packaged semiconductor die 230 has the advantage of a high density and a low manufacturing cost resulting from the process described above. Furthermore, packaged semiconductor die 230 typically is subjected to a complete functional and parametric test prior to mounting on leadframe 300. Hence, packaged semiconductor die 230 is known to be a good device. If shielding or heat sinking is required by the application, packaged semiconductor die 230 can be formed having localized shielding or heat sinks (not shown), or other specialized features for a given application. Note that the above mentioned localized shielding or sinking is less costly than would be the case if such features were provided on the physically larger semiconductor device 20, particularly where all of the components do not require shielding or sinking. In other embodiments, packaged semiconductor die 230 includes leaded, dual inline, ball grid array, pin or other types of packaged semiconductor devices.

Semiconductor die 130 is mounted and/or electrically coupled to a lead or flag 140 of leadframe 300. In an embodiment where semiconductor die 130 comprises a power transistor or other power dissipating device, leadframe 300 is formed with a high thickness 98 of about five hundred micrometers to facilitate heat removal. Thickness 98 is greater than thickness 99 because semiconductor die 130 generates heat and conducts more power than does packaged semiconductor die 230. When etching metal material to form leadframe 300, particular attention must be provided to the thickness 98 of the leadframe in relation to the formation of leads 30, 35, 150 or flag 140. Large lateral dimensions or pitch 47 requirements increase the thickness 98 proportionately due to the etching characteristics of the processes used. Thus for large pitches or lateral dimensions, the thickness 98 is consequently increased. In general, producing leadframes with increased lateral dimensions is less costly than those having smaller lateral dimensions.

Semiconductor die 130 is electrically and/or thermally coupled to flag 140 using an adhesive or solder paste (not shown) and to lead 35 by a bonding wire 110. Bonding wire is 110 is attached as typical in the art using a large wire bond tool (not shown) at a first location 120 on the die 130 and then drawn over to the lead 35 where it is then ultrasonically attached to a portion 37 and the tool removed. Portion 37 of lead 35 includes copper or aluminum as is typical with an etched leadframe. Similarly, bonding wire 115 connects semiconductor die 130 to lead 150. Leadframe 300 is not coated with nickel silver alloy material because such a coating is not needed for attaching aluminum bond wires such as bonding wires 110 and 115. Hence, leadframe 300 can be formed at a low manufacturing cost.

Leadframes 200 and 300 are simpler and less costly to manufacture than are printed circuit boards in that printed circuit boards are made by successively laminating layers of dielectric and conductive or metal materials and etching the metal layers to leave regions of metal acting as electrical traces or leads that are supported by the underlying dielectric layers. In contrast, leadframes are formed by etching, milling, stamping or otherwise removing material from metal sheets to form conductive traces. There is no underlying dielectric material to support the traces while they are being formed and no need for a laminating process, so leadframes are easier to fabricate and have a substantially lower cost. Lateral dimensions or pitch of the electrical traces or leads of a printed circuit board can be altered without altering the phenolic material thickness. Printed circuit boards are also more expensive to produce than leadframe 300 where a metal (such as copper) substrate is chemically etched leaving a patterned metal having void 45.

In further contrast to the printed circuit board, leadframe 300 void 45 are filled when covered with an encapsulant.

Leadframe 300 typically is formed having void 45, as well as leadlocks 31 as shown on leads 150, 140, 35, and 30. Leadlocks of various dimensions can be formed including generally rectangular, reentrant, angular, or round by removing a thickness 97 of material from leadframe 300.

Additionally, as above, during the wire bonding process, a window frame (not shown) holds down the leadframe to keep it from moving during the wire bonding process. The window frame has a window that allows for the wire bond tool head to travel a distance 47 within the window of the window frame while bonding from the die to the lead. In one embodiment, bonding wire 110 or 115 includes aluminum material.

In one embodiment, bonding wire 110 or 115 includes bonding wire formed to a diameter of greater than three hundred fifty micrometers. Such large diameter aluminum wires are needed to carry the large currents produced by semiconductor die 130. For aluminum wire of three hundred fifty micrometers in diameter a typical wire bond tool head is about four thousand micrometers in diameter.

Once semiconductor die 130 is mounted to leadframe 300 as described above, packaged semiconductor die 230 is mounted or electrically coupled to leadframe 300 using for example a solder ball or paste 50. The solder paste process is compatible with mounting or electrically coupling semiconductor die 130 to leadframe 300 and with the process used to attach bonding wires 110 and 115. That is, the mechanical and electrical properties are not altered. Leadframe 300 is then covered with an encapsulant 10 to form semiconductor device 20. Semiconductor device 20 has a lateral dimension or pitch 46 for coupling to a customer printed circuit board. Dimension 46 is a minimum spacing between adjacent leads of a customer's circuit board, and typically is larger than the smaller of either lateral dimensions 48 or 47.

One advantage of forming the semiconductor device 20 as described above is that leadframe 200 can be formed with thinner metal to achieve a fine pitch that minimizes circuit parasitics and enhances the transmission of signals while leadframe 300 can be made from a thicker material to take advantage of the low thermal and electrical resistance needed for operating semiconductor die 130. That is, leadframes of various thicknesses can be utilized to accommodate semiconductor dice having different packaging requirements like thermal management, mounting techniques, cost, functional test, electrical shielding, or wire bonding. In the example above, the thickness of the leadframe used to mount the drive transistor is much thicker than that of the analog switch as the drive transistor conducts large currents and dissipates more power as compared to the analog switch.

These leadframes can also be formed as well known in the art having half etched portions of leads to form traces interconnecting various leads without extending externally from the encapsulant (not shown).

Furthermore, since semiconductor die 130 requires a window frame (not shown) as mentioned above for wire bonding to the leadframe, distance 59 can be made small as the window frame can be placed down prior to the mounting of packaged semiconductor die 230 to allow wire bonding of semiconductor die 130.

A further advantage of the semiconductor device 20 is that the distance 298 can be further reduced as no window frame lateral reserve space is required during wire bonding. Eliminating window frame reserve space allows the outer dimension 299 of the semiconductor device to be small. Another advantage is complexity of the packaged semiconductor device 20 can be higher than that of the customers' printed circuit motherboard. Thus the customer can reduce costs by not having to provide areas of expensive localized high density or varying thickness printed circuitry to directly accommodate the various die now contained within the packaged semiconductor device 20.

Figure 3:
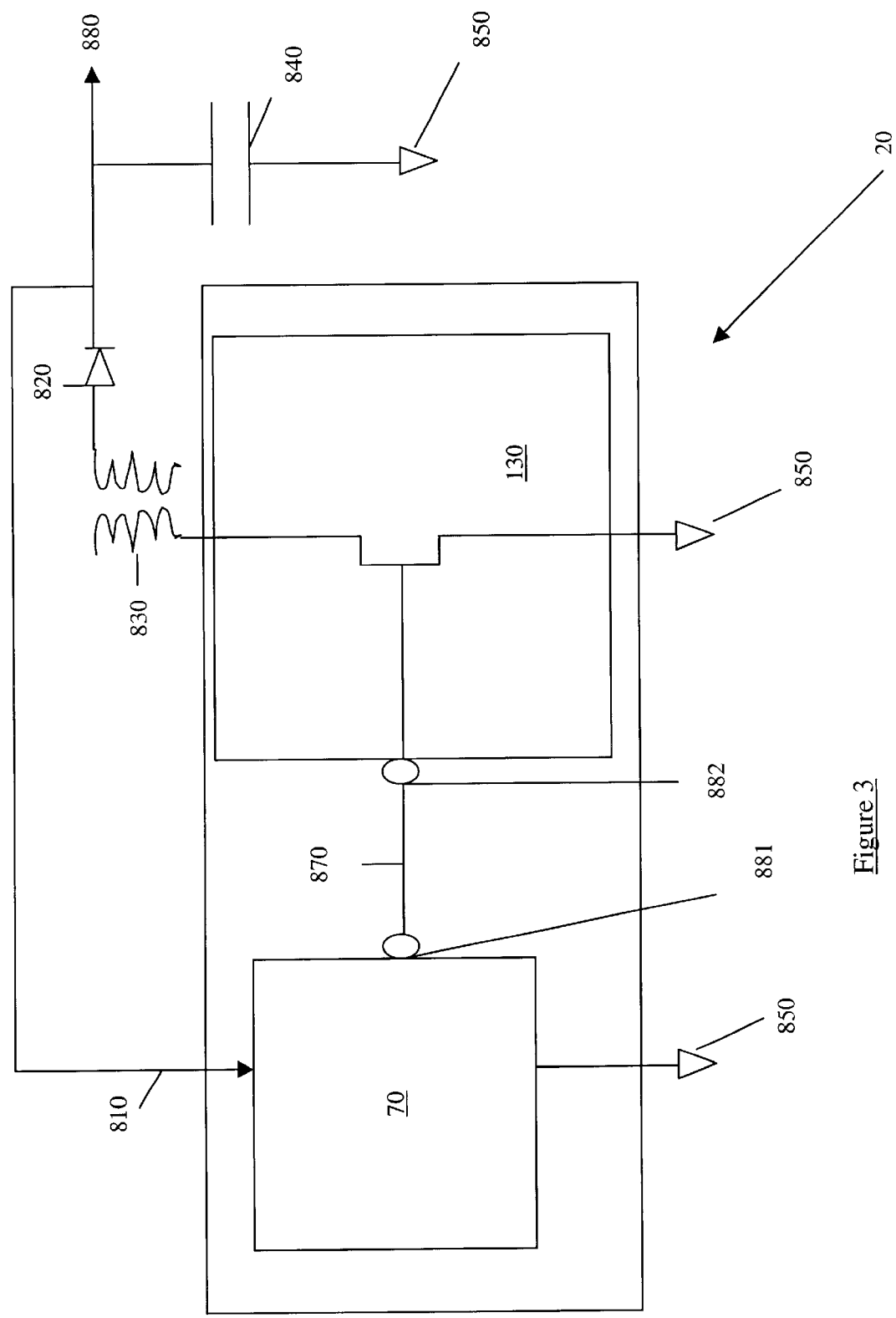
FIG. 3 is a schematic diagram of one embodiment of the semiconductor device as applied to a voltage regulator.

FIG. 3 is a schematic view of the voltage regulator of FIG. 2, showing packaged semiconductor die or voltage regulator 20 having an output 881 of analog switch 70 coupled to the gate input 882 of drive transistor 130 by the short conductive path 870 formed internal to regulator 20 generally by bond wire 56, lead 90, lead 35, and bond wire 110.

Figure 1:
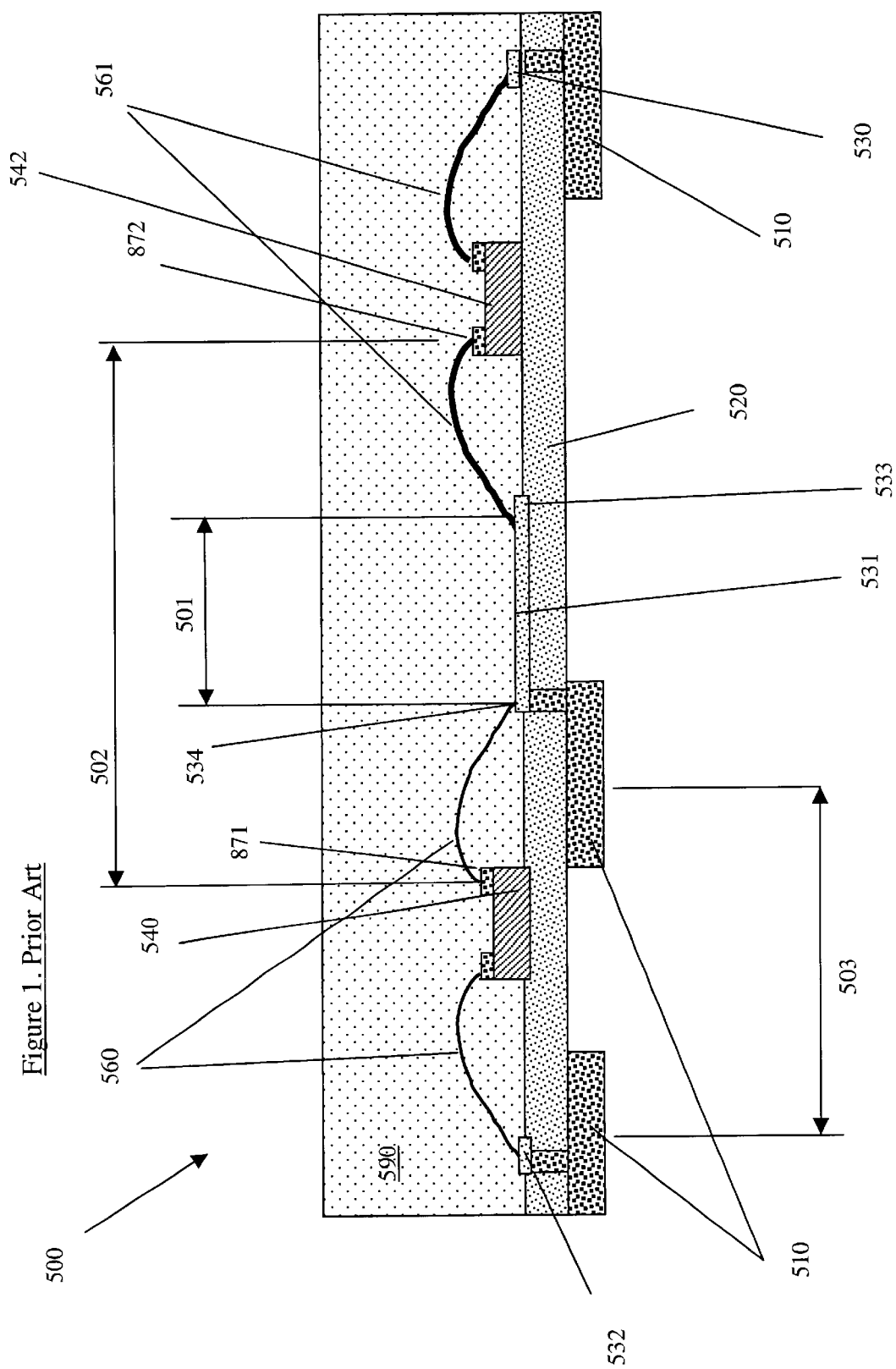
FIG. 1 is a cross sectional view of a prior art multi-chip module.

As described above, this path is further shortened by eliminating the need to provide additional space between wire bonds for the window frame used to hold down the leadframe during prior art individual die wire bond process. This results in the conductive path 870 being much shorter than those of prior art (refer to FIG. 1). Since this path is shorter than prior art, the drive transistor can be switched on and off more quickly enabling faster switching speeds and improved operation.

As is typical, the customer use of the voltage regulator 20 includes coupling of semiconductor die 70 to a ground 850, and to a feedback loop 810 from the output 880. Drive transistor 130 is coupled to ground 850 and to transformer 830. The transformer 830 is coupled through diode 820 to the output 880. Capacitor 840 is coupled to ground 850 and to the output 880 as a storage device and to filter noise.

FIG. 4 is a top view of semiconductor device 20 during a stage of fabrication, illustrating a leadframe 300 along with a window frame 620 used for attaching wire bonds 110 and 115 to semiconductor die 130. Prior to the mounting of packaged semiconductor die 230 to region 160, frame 620 is lowered into contact with leadframe 300 and wire bonds 110 and 115 are made within the window 635 of the window frame 620. Window frame 620 is pressed against leadframe 300 as shown to hold down or secure leadframe 300 during the wire bond process. Note that window frame 620 overlaps region 160, which is reserved for the mounting of packaged semiconductor die 230, which allows packaged semiconductor die 230 to be located closer to semiconductor 130 than would be possible if a bare die were mounted in region 160.

FIG. 5 is a top view of semiconductor device 20 during a stage of fabrication further illustrating leadframe 300 as a portion of a leadframe matrix 650, and including semiconductor die 130 and packaged semiconductor die 230. Packaged semiconductor die 230 is mounted to leadframe 300 after all of the bare semiconductor dice (including semiconductor die 130) are mounted to their respective leadframes and the associated wire bonds formed.

Leadframe matrix 650 is then subjected to a blanket encapsulation process, during which leadframe 300 is encapsulated with encapsulant 10. After encapsulation, the leadframe 650 is sawn along X and Y planes to singulate and simultaneously form leads 651 and packaged semiconductor device 20.

FIG. 6 shows a cross sectional view of an alternate embodiment of semiconductor device 20 comprising two or more packaged semiconductor die 230 and 231 mounted or electrically coupled to leadframe 300 and encapsulated with an encapsulant 10. Packaged semiconductor die 230 is comprised of a die 70 mounted and electrically connected to leadframe 200 and covered with encapsulant 210 as above.

Packaged semiconductor die 231 is comprised of die 134 mounted and electrically connected to leadframe 133 and covered with encapsulant 211 similar as above. Although shown as having similar package types, packaged semiconductor die 230 and 231 can be of other package and/or die types including a die mounted to a leadframe such as a ball grid array, dual inline package, pin grid array and the like. Distance 777 between packaged semiconductor die 230 and 231 can be extremely short for many of the above reasons including each of the packaged semiconductor die 230 or 231 formed having a minimum lateral width 774 or 775.

Additionally, although not shown, either packaged semiconductor device 230 and or 231 could comprise a semiconductor device like semiconductor device 20, or instead use different mounting or coupling techniques such as leaded frame, ball grid array, pin lead and the like.

Another advantage of the semiconductor device 20 of FIG. 5 is that the distance 777 can be further reduced as no window frame reserve is required as no wire bonding is performed to integrate or mount the two semiconductor devices. This further elimination allows the outer dimension 776 of the semiconductor device to be at a minimum as compared to prior art.

Furthermore, the complexity of the packaged semiconductor device 20 can be higher than that of the customers' printed circuit motherboard, as the customer can reduce costs by not having to provide areas of expensive localized high density printed circuitry or thicker metal traces to directly accommodate the various die now contained within the packaged semiconductor device 20.

A further advantage of the packaged semiconductor device 20 over prior art is that it enables systems solutions comprised of multiple die, various die technology, various die dimensions, die pitch, and interconnect technologies to be cost effectively formed within a single package. Other prior art systems solutions comprised integrating various die manufacturing technologies into a single silicon semiconductor solution which is expensive, difficult and results in a die having lateral proportions greater than those of the above packaged semiconductor device 20.

What is claimed is:

1. A semiconductor device, comprising:
   a first packaged semiconductor device including
      a first leadframe,
      a first semiconductor die electrically coupled to a lead of the first leadframe, and
      a first encapsulant material covering the first leadframe and the first semiconductor die;
   a second semiconductor die;
   a second leadframe having a first lead for electrically coupling to the second semiconductor die and a second lead attached to the lead of the first leadframe; and
   a second encapsulant material covering the second leadframe and the first packaged semiconductor device.

2. The semiconductor device of claim 1, further comprising a first bond wire formed with a first material for electrically coupling the first semiconductor die to the lead of the first leadframe.

3. The semiconductor device of claim 2, further comprising a second bond wire formed with a second material for electrically coupling the second semiconductor to the first lead of the second leadframe.

4. The semiconductor device of claim 2, wherein the first material includes gold.

5. The semiconductor device of claim 3, wherein the second material includes aluminum.

6. The semiconductor device of claim 4, wherein the first material is formed to a diameter of less than 0.002 inches.

7. The semiconductor device of claim 5, wherein the second material is formed to a diameter of greater than 0.014 inches.

8. The semiconductor device of claim 4, wherein the first leadframe includes a nickel silver alloy coating for attaching the gold bond wire.

9. The semiconductor device of claim 5, wherein the second leadframe includes copper or aluminum for attaching the aluminum bond wire.

10. The semiconductor device of claim 1, wherein the first leadframe has a thickness less than the second leadframe.

11. The semiconductor device of claim 1, wherein the second leadframe includes a leadlock.

12. A semiconductor device, comprising:
    a first packaged semiconductor device including
       a first leadframe,
       a first semiconductor die electrically coupled to
       a pin of the first leadframe,
       a first encapsulant material formed over the first semiconductor die and the first leadframe;
    a second leadframe for attaching to the first leadframe; and
    a second encapsulant material formed over the second leadframe and the first packaged semiconductor device.

13. The semiconductor device of claim 1, wherein the first packaged semiconductor device includes an analog switch.

14. The semiconductor device of claim 1 wherein the second semiconductor die includes a power transistor.

15. The semiconductor device of claim 12, wherein the first leadframe pin has a pitch smaller than pitch of a pin of the second leadfrarne.

16. A package for housing multiple semiconductor dice, comprising:
    a first leadframe having a region for mounting a first semiconductor die;
    a first encapsulant over the region;
    a second leadframe having a flag for mounting a second semiconductor die, wherein the second leadframe is for mounting a lead of the first leadframe; and
    a second encapsulant over the flag and the first encapsulant.

17. A semiconductor component, comprising:
    a first leadframe having a first thickness;
    a first semiconductor die electrically coupled to the first leadframe;
    a first encapsulant covering the first leadframe and the first semiconductor die;
    a second semiconductor die;
    a second leadframe having a second thickness electrically coupled to the second semiconductor die and the first leadframe; and
    a second encapsulant covering the second semiconductor die and the first encapsulant.

18. The semiconductor component of claim 17, wherein the first leadframe thickness is smaller than the second leadframe thickness.

19. A semiconductor component, comprising:
    a first leadframe;
    a first semiconductor die electrically coupled to a lead of the first leadframe;
    a first encapsulant covering the first semiconductor die;
    a second leadframe;

a second semiconductor die electrically coupled to a lead of the second leadframe;

a second encapsulant covering the second semiconductor die;

a third leadframe having a first lead for mounting to the first leadframe and a second lead for electrically coupling to the second leadframe; and a third encapsulant covering the third leadframe and the first and second encapsulant.

20. An integrated circuit, comprising:

a first leadframe;

a semiconductor device for mounting on the first leadframe;

a first encapsulant material covering the first leadframe;

a semiconductor component;

a second leadframe having a first region for mounting the semiconductor component and a second region for mounting the first leadframe; and a second encapsulant material covering the semiconductor component and the first encapsulant material.

* * * * *